(12) United States Patent
Moon

(10) Patent No.: US 10,593,836 B2
(45) Date of Patent: Mar. 17, 2020

(54) LIGHT-EMITTING DEVICE

(71) Applicant: LG INNOTEK CO., LTD., Seoul (KR)

(72) Inventor: Ji Hyung Moon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/744,473

(22) PCT Filed: Jul. 18, 2016

(86) PCT No.: PCT/KR2016/007792
§ 371 (c)(1),
(2) Date: Jan. 12, 2018

(87) PCT Pub. No.: WO2017/014512
PCT Pub. Date: Jan. 26, 2017

(65) Prior Publication Data
US 2018/0204979 A1   Jul. 19, 2018

(30) Foreign Application Priority Data
Jul. 21, 2015   (KR) .................. 10-2015-0103168

(51) Int. Cl.
*H01L 33/00* (2010.01)
*H01L 33/38* (2010.01)
(Continued)

(52) U.S. Cl.
CPC ............ *H01L 33/38* (2013.01); *H01L 27/156* (2013.01); *H01L 33/382* (2013.01); *H01L 33/62* (2013.01)

(58) Field of Classification Search
CPC ........ H01L 33/38; H01L 33/382; H01L 33/62
See application file for complete search history.

(56) References Cited

U.S. PATENT DOCUMENTS

| 6,547,249 B2 | 4/2003 | Collins, III et al. |
| 2002/0171087 A1 | 11/2002 | Krames et al. |

(Continued)

FOREIGN PATENT DOCUMENTS

| CN | 101305475 A | 11/2008 |
| CN | 102201426 A | 9/2011 |

(Continued)

*Primary Examiner* — Kimberly N Rizkallah
*Assistant Examiner* — Alexander Belousov
(74) *Attorney, Agent, or Firm* — Birch, Stewart, Kolasch & Birch, LLP

(57) ABSTRACT

The light-emitting device according to one embodiment includes a substrate; a plurality of light-emitting cells disposed on the substrate so as to be spaced apart from each other; and a connection line configured to electrically interconnect neighboring light-emitting cells, wherein each of the light-emitting cells includes: a light-emitting structure including a first semiconductor layer, an active layer, and a second semiconductor layer disposed on the substrate; and first and second electrodes configured to be electrically connected to the first and second semiconductor layers respectively, wherein the light-emitting cells include: a first power cell configured to receive first power via the first electrode; and a second power cell configured to receive second power via the second electrode, and wherein the first electrode in the first power cell has a first planar shape different from a second planar shape of the second electrode in the second power cell.

20 Claims, 5 Drawing Sheets

(51) Int. Cl.
*H01L 27/15* (2006.01)
*H01L 33/62* (2010.01)

(56) References Cited

U.S. PATENT DOCUMENTS

| | | |
|---|---|---|
| 2006/0284195 A1 | 12/2006 | Nagai |
| 2008/0191222 A1 | 8/2008 | Lee |
| 2009/0267085 A1* | 10/2009 | Lee .......................... F21K 9/00 |
| | | 257/88 |
| 2009/0272991 A1* | 11/2009 | Lee ..................... H01L 25/0753 |
| | | 257/91 |
| 2012/0043896 A1 | 2/2012 | Lee et al. |
| 2015/0255504 A1* | 9/2015 | Jang ..................... H01L 27/153 |
| | | 257/88 |

FOREIGN PATENT DOCUMENTS

| | | |
|---|---|---|
| CN | 104300069 A | 1/2015 |
| JP | 2011-044741 A | 3/2011 |
| JP | 2012-253360 A | 12/2012 |
| KR | 10-0758541 B1 | 9/2007 |
| KR | 10-2012-0018646 A | 3/2012 |
| KR | 10-2014-0035243 A | 3/2014 |
| KR | 10-2014-0103678 A | 8/2014 |

\* cited by examiner

[FIG. 1]
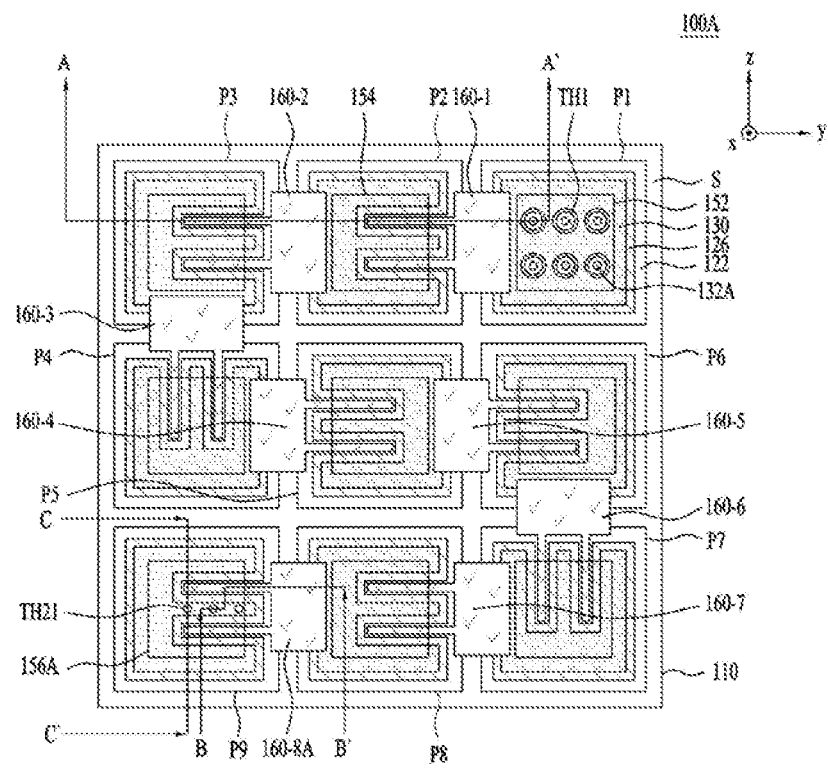
[FIG. 2]
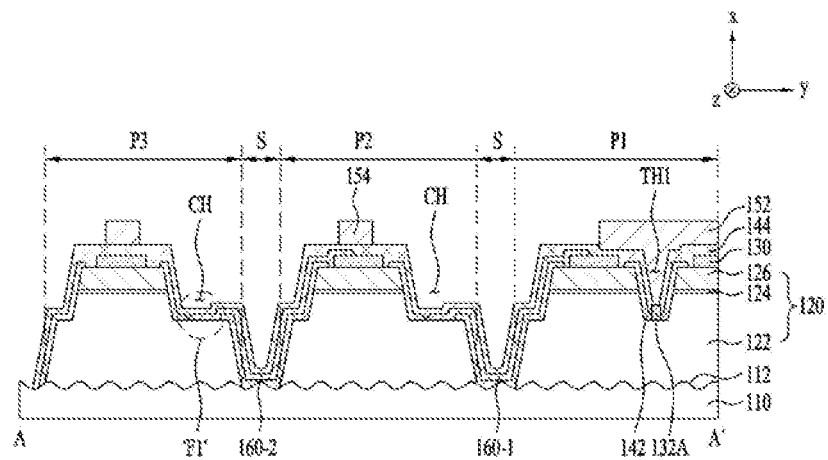

[FIG. 3]
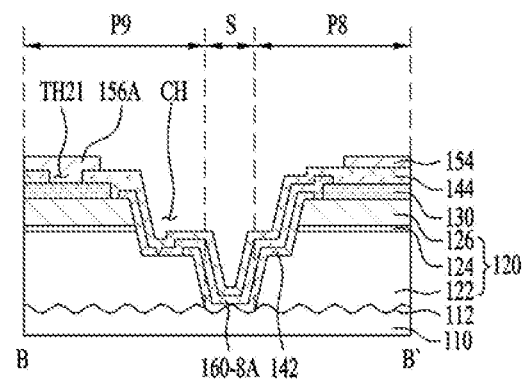
[FIG. 4a]
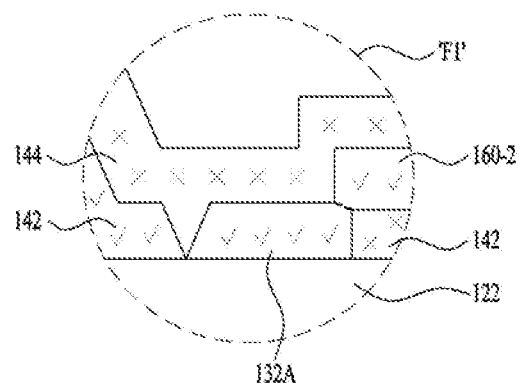
[FIG. 4b]
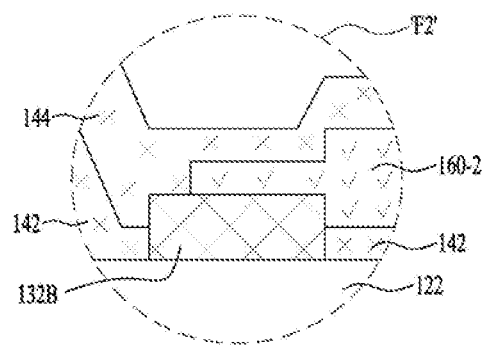

【FIG. 5】
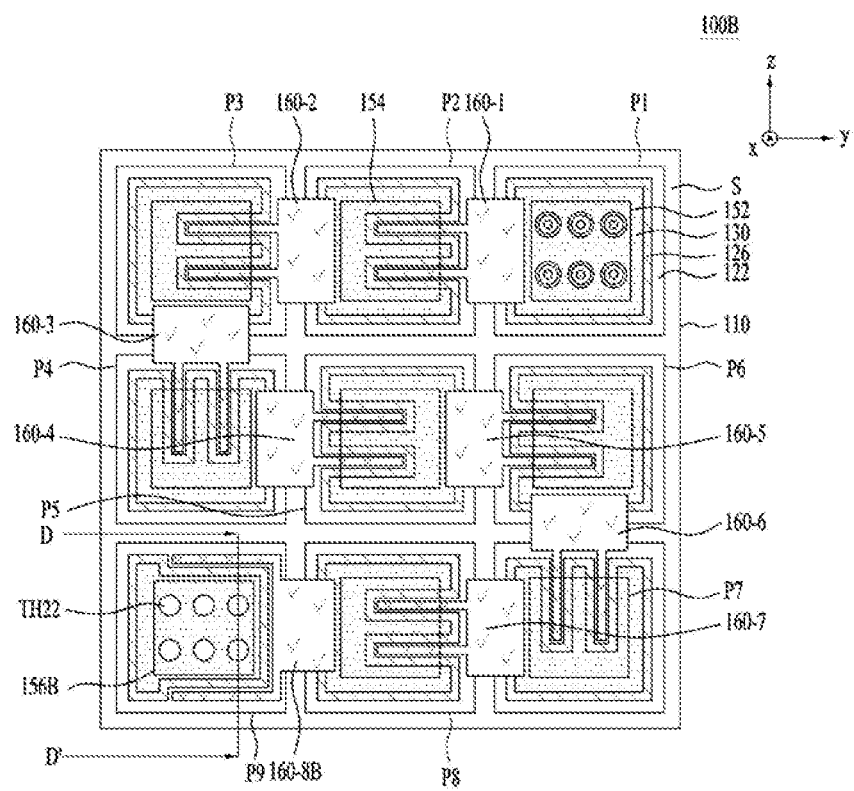
【FIG. 6】
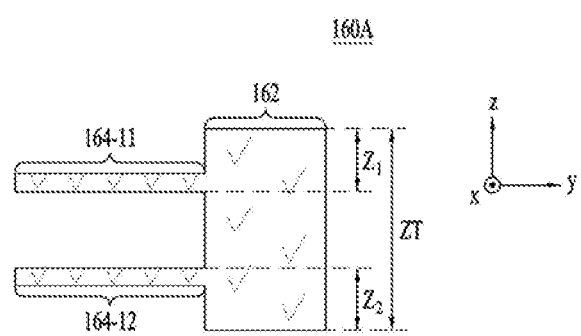

[FIG. 7]
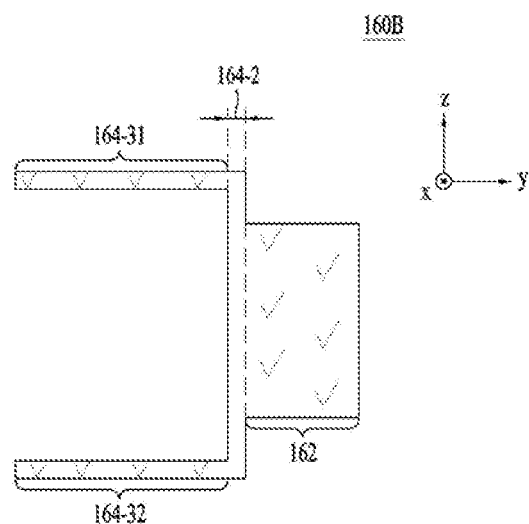
[FIG. 8]
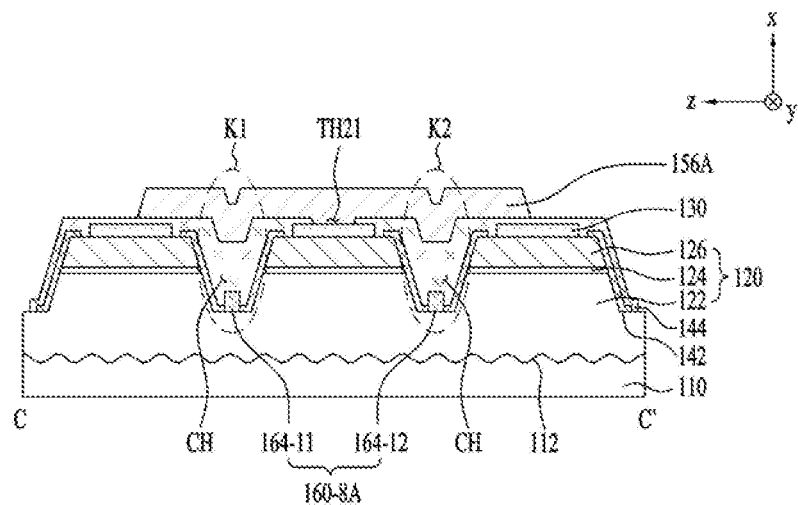

[FIG. 9]
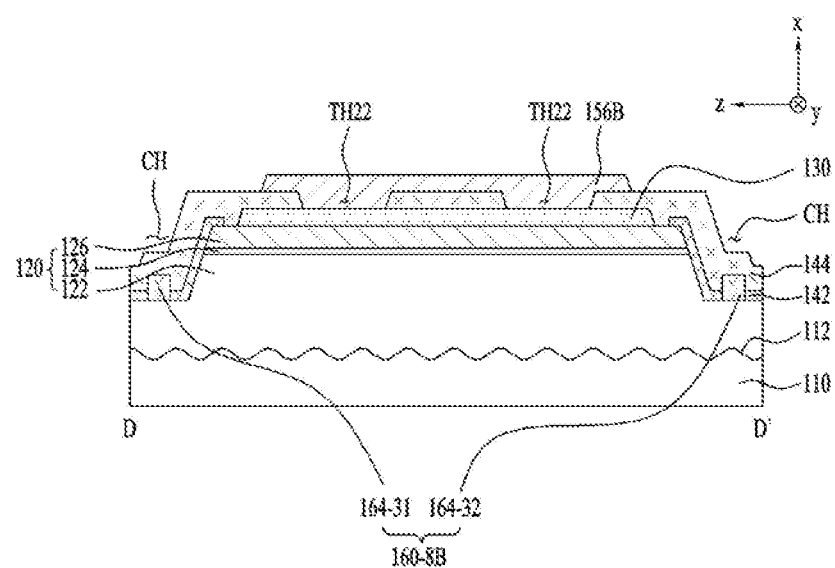
[FIG. 10]
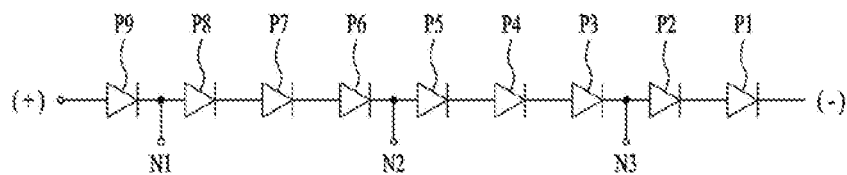

LIGHT-EMITTING DEVICE

CROSS REFERENCE TO RELATED APPLICATIONS

This application is National Phase of PCT International Application No. PCT/KR2016/007792, filed on Jul. 18, 2016, which claims priority under 35U.S.C. 119(a) to Patent Application No. 10-2015-0103168, filed in the Republic of Korea on Jul. 21, 2015, all of which are hereby expressly incorporated by reference into the present application.

TECHNICAL FIELD

Embodiments relate to light-emitting devices.

BACKGROUND ART

Light-emitting devices capable of realizing high-luminance white light, such as red, green, and blue light-emitting diodes (LEDs), have been developed based on the development of molecular beam epitaxial growth and metal organic chemical vapor deposition of gallium nitride (GaN), and the like.

Such LEDs have excellent environmental friendliness because they include no environmentally harmful materials such as mercury (Hg), which has conventionally been used in lighting apparatuses such as, for example, incandescent lamps and fluorescent lamps, and also have other advantages, for example, a long lifespan and low power consumption. Therefore, existing light sources are being replaced with LEDs. The core competitive factor of the LEDs is realization of high luminance by high-efficiency and high-output chip and package technologies.

Such light-emitting devices need to have uniform illuminance and high reliability.

Technical Object

Embodiments provide a light-emitting device having increased reliability and excellent light-emitting uniformity.

Technical Solution

To achieve the object described above, an embodiment may provide a light-emitting device including a substrate, a plurality of light-emitting cells disposed on the substrate so as to be spaced apart from each other, and a connection line configured to electrically interconnect neighboring light-emitting cells, wherein each of the light-emitting cells includes a light-emitting structure including a first semiconductor layer, an active layer, and a second semiconductor layer disposed on the substrate, and first and second electrodes electrically connected to the first and second semiconductor layers respectively, wherein the light-emitting cells include a first power cell configured to receive first power via the first electrode and a second power cell configured to receive second power via the second electrode, and wherein the first electrode in the first power cell has a first planar shape different from a second planar shape of the second electrode in the second power cell.

For example, the light-emitting device may further include a first insulation layer disposed between the connection line and the neighboring light-emitting cells to electrically insulate the connection line and the neighboring light-emitting cells from each other.

For example, the light-emitting device may further include a first bonding pad electrically connected to the first electrode, a second bonding pad electrically connected to the second electrode, and a second insulation layer disposed between the first bonding pad and the second electrode to electrically insulate the first bonding pad and the second electrode from each other.

For example, the first electrode may be connected to the first bonding pad through a plurality of first through-holes, which pass through the second insulation layer, the second semiconductor layer, and the active layer, and the second electrode may be connected to the second bonding pad through a plurality of second through-holes, which pass through the second insulation layer.

For example, the first planar shape may include at least one of a planar arrangement form of the first through-holes, a number of the first through-holes, a planar shape of each of the first through-holes, a distance between the first through-holes, or a planar size of each of the first through-holes, and the second planar shape may include at least one of a planar arrangement form of the second through-holes, a number of the second through-holes, a planar shape of each of the second through-holes, a distance between the second through-holes, or a planar size of each of the second through-holes.

For example, the number of the first through-holes in the first planar shape and the number of the second through-holes in the second planar shape may be different from each other, or may be the same.

For example, the first through-holes in the first planar shape may be arranged in at least one direction of a first direction or a second direction, which crosses a thickness direction of the light-emitting structure. The first through-holes may be arranged at a constant distance.

For example, the second through-holes in the second planar shape may be arranged in at least one direction of a first direction or a second direction, which crosses a thickness direction of the light-emitting structure. The second through-holes may be arranged at a constant distance.

For example, each of the light-emitting cells excluding the first power cell may further include a contact hole configured to expose the first semiconductor layer in the light-emitting structure, and the connection line may be electrically connected to the second semiconductor layer of one of the neighboring light-emitting cells and is electrically connected to the first semiconductor layer through the contact hole of a remaining one of the neighboring light-emitting cells.

For example, the contact hole may include a plurality of contact holes disposed parallel to each other and spaced apart from each other in a direction, which crosses a thickness direction of the light-emitting structure.

For example, the connection line may include a connection body electrically spaced apart from a lateral portion of the light-emitting structure of one of the neighboring light-emitting cells by the first insulation layer and electrically connected to the second electrode of the one of the neighboring light-emitting cells, and a plurality of connection branches extending from the connection body so as to be electrically connected to the first semiconductor layer through the contact holes included in a remaining one of the neighboring light-emitting cells.

For example, the connection branches may include a plurality of first connection branches extending from the connection body in the first direction, which crosses the thickness direction, and disposed so as to be spaced apart from each other in a second direction, which crosses each of the first direction and the thickness direction.

Alternatively, for example, the connection branches may include a second connection branch extending from the connection body so as to be disposed in a second direction, which crosses the thickness direction, and a third connection branch extending from the second connection branch so as to be disposed in a first direction, which crosses each of the thickness direction and the second direction.

For example, each of the connection branches may have a striped planar shape.

For example, the second through-holes may be arranged in a first direction between the connection branches.

For example, the connection branches may be disposed so as to overlap the second bonding pad in the thickness direction, or may be disposed so as not to overlap the second bonding pad in the thickness direction.

For example, the connection branches may be disposed on an edge of the second power cell.

Another embodiment provides a light-emitting device including a substrate, a plurality of light-emitting cells disposed on the substrate so as to be spaced apart from each other, and a connection line configured to electrically interconnect neighboring light-emitting cells, wherein each of the light-emitting cells includes a light-emitting structure including an n-type semiconductor layer, an active layer, and a p-type semiconductor layer disposed on the substrate and n-type and p-type electrodes electrically connected to the n-type and p-type semiconductor layers respectively, wherein the light-emitting cells includes a negative power cell configured to receive a negative voltage via an n-type bonding pad connected to the n-type electrode and a positive power cell configured to receive a positive voltage via a p-type bonding pad connected to the p-type electrode, wherein the positive power cell further includes a contact hole passing through the p-type semiconductor layer and the active layer to expose the n-type semiconductor layer, wherein the connection line is electrically connected to the n-type semiconductor layer through the contact hole, and wherein the contact hole is disposed so as not to overlap the p-type bonding pad in a thickness direction of the light-emitting structure.

Advantageous Effects

A light-emitting device according to embodiments has excellent light-emitting uniformity and increased reliability.

DESCRIPTION OF DRAWINGS

FIG. 1 illustrates a plan view of a light-emitting device according to an embodiment.

FIG. 2 illustrates a cross-sectional view taken along line A-A' illustrated in FIG. 1.

FIG. 3 illustrates a cross-sectional view taken along line B-B' illustrated in FIG. 1.

FIG. 4a illustrates an enlarged cross-sectional view of portion "F1" illustrated in FIG. 2 according to one embodiment, and FIG. 4b illustrates an enlarged cross-sectional view of portion "F1" illustrated in FIG. 2 according to another embodiment.

FIG. 5 illustrates a plan view of a light-emitting device according to another embodiment.

FIG. 6 illustrates a plan view of one embodiment of an $n^{th}$ connection line included in the light-emitting devices illustrated in FIGS. 1 and 5.

FIG. 7 illustrates a plan view of another embodiment of the $n^{th}$ connection line included in the light-emitting devices illustrated in FIGS. 1 and 5.

FIG. 8 illustrates a cross-sectional view taken along line C-C' illustrated in FIG. 1.

FIG. 9 illustrates a cross-sectional view taken along line D-D' illustrated in FIG. 5.

FIG. 10 illustrates a circuit diagram of the light-emitting devices illustrated in FIGS. 1 and 5.

BEST MODE

Hereinafter, embodiments will be described in detail with reference to the accompanying drawings, in order to concretely describe the disclosure and to assist in understanding of the disclosure. However, the embodiments disclosed here may be altered into various other forms, and the scope of the disclosure should not be construed as being limited to the embodiments. The embodiments disclosed here are provided in order to more completely describe the disclosure to those of ordinary skill in the art.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

Although light-emitting devices 100A and 100B according to embodiments will be described using the Cartesian coordinate system for convenience, they may of course be described using other coordinate systems. With the Cartesian coordinate system, although the x-axis, the y-axis and the z-axis are orthogonal to one another, but the embodiments are not limited thereto. That is, the x-axis, the y-axis and the z-axis may cross one another.

FIG. 1 illustrates a plan view of a light-emitting device 100A according to an embodiment, FIG. 2 illustrates a cross-sectional view taken along line A-A' illustrated in FIG. 1, FIG. 3 illustrates a cross-sectional view taken along line B-B' illustrated in FIG. 1, FIG. 4a illustrates an enlarged cross-sectional view of one embodiment of portion "F1" illustrated in FIG. 2, and FIG. 4b illustrates an enlarged cross-sectional view of another embodiment F2 of portion "F1" illustrated in FIG. 2.

Referring to FIGS. 1 to 4b, the light-emitting device 100A may include a substrate 110, a light-emitting structure 120, a first electrode 132A or 132B, a second electrode 130, first and second insulation layers (or passivation layers) 142 and 144, first and second bonding pads 152 and 156A, a connection pad 154, and first to $N^{th}$ connection lines 160-1 to 160-N (here, N is a positive integer of 2 or more).

To assist understanding, in FIG. 1, the first and second bonding pads 152 and 156A and the connection pad 154 are illustrated as being transparent, and in order to show the state in which the light-emitting structure 120, the first electrode 132A or 132B, and the second electrode 130 are disposed, the illustration of the first and second insulation layers 142 and 144 is omitted in FIG. 1.

The substrate 110 may be formed of a material that is suitable for the growth of semiconductor materials, for example, a carrier wafer. In addition, the substrate 110 may be formed of a material having excellent thermal conductivity, and may be a conductive substrate or an insulating substrate. In addition, the substrate 110 may be formed of a material having light transmittance, and may have a sufficient mechanical strength to be easily separated as a separate chip via a scribing process and a braking process without causing bending of the entire nitride light-emitting structure 120 of the light-emitting device 100A. For example, the substrate 110 may be a material including at least one of sapphire ($Al_2O_3$), GaN, SiC, ZnO, Si, GaP, InP, $Ga_2O_3$, GaAs, or Ge. The upper surface of the substrate 110 may have a convex-and-concave pattern shape and, for example, may include a patterned sapphire substrate (PSS) 112.

In addition, although not illustrated, a buffer layer may further be disposed between the substrate 110 and the light-emitting structure 120. The buffer layer may be formed using group III-V compound semiconductors. The buffer layer serves to reduce the difference in lattice constant between the substrate 110 and the light-emitting structure 120. For example, the buffer layer may include AlN or may include an undoped nitride, without limitation thereto. The buffer layer may be omitted depending on the kind of the substrate 110 and the kind of the light-emitting structure 120.

Hereinafter, for the convenience of description, the number M of light-emitting cells (or light-emitting areas) is assumed to be nine, but the embodiment is not limited thereto. Even when the number of light-emitting cells is greater or less than 9, the embodiment may be equally applied. Here, M is a positive integer of 1 or more and may be N+1.

The multiple light-emitting cells may be disposed on the substrate 110 so as to be spaced apart from each other. As illustrated in FIG. 1, the multiple light-emitting cells P1 to P9 may be spaced apart from each other in directions (e.g. the y-axis and the z-axis) that cross the thickness direction (e.g. the x-axis) of the light-emitting structure 120.

First, the multiple light-emitting areas P1 to P9 are referred to as a first light-emitting area to a ninth light-emitting area in sequence. That is, the first bonding pad 152 may be located in the first light-emitting area P1 and the second bonding pad 156A may be located in the ninth light-emitting area P9, but the embodiment is not limited thereto. When the first semiconductor layer 122 is an n-type semiconductor layer, the first bonding pad 152 may be an n-type bonding pad. When the second semiconductor layer 126 is a p-type semiconductor layer, the second bonding pad 156A may be a p-type bonding pad.

The first to ninth light-emitting cells are disposed respectively in the first to ninth light-emitting areas of the substrate 110. That is, the first light-emitting cell is disposed in the first light-emitting area P1 of the substrate 110, the second light-emitting cell is disposed in the second light-emitting area P2 of the substrate 110, the third light-emitting cell is disposed in the third light-emitting area P3 of the substrate 110, the fourth light-emitting cell is disposed in the fourth light-emitting area P4 of the substrate 110, the fifth light-emitting cell is disposed in the fifth light-emitting area P5 of the substrate 110, the sixth light-emitting cell is disposed in the sixth light-emitting area P6 of the substrate 110, the seventh light-emitting cell is disposed in the seventh light-emitting area P7 of the substrate 110, the eighth light-emitting cell is disposed in the eighth light-emitting area P8 of the substrate 110, and the ninth light-emitting cell is disposed in the ninth light-emitting area P9 of the substrate 110. In this way, an $m^{th}$ light-emitting cell (1≤m≤M) is disposed in an $m^{th}$ light-emitting area Pm of the substrate 110. Hereinafter, for the convenience of description, the $m^{th}$ light-emitting cell is designated by "Pm".

Each of the first to $M^{th}$ light-emitting cells P1 to PM may include the light-emitting structure 120 disposed on the substrate 110, the first electrode 132 or 132B, and the second electrode 130. The light-emitting structure 120, which constitutes one light-emitting cell, may be separated from the light-emitting structure 120 of another light-emitting cell by a boundary area S. The boundary area S may be an area that is located on the periphery of each of the first to $M^{th}$ light-emitting cells (P1 to PM), and may be the substrate 110.

The first to $M^{th}$ light-emitting cells P1 to PM may have the same area, without limitation thereto. For example, according to another embodiment, the first to $M^{th}$ light-emitting cells P1 to PM may have respectively different areas. According to still another embodiment, some of the first to $M^{th}$ light-emitting cells P1 to PM may have the same area and others may have different areas.

The light-emitting structure 120 of each of the light-emitting cells P1 to PM may include a first semiconductor layer 122, an active layer 124, and a second semiconductor layer 126, which are sequentially disposed on the substrate 110.

The first semiconductor layer 122 may be disposed between the substrate 110 and the active layer 124, may include a semiconductor compound, may be formed of, for example, group III-V or group II-VI compound semiconductors, and may be doped with a first conductive dopant. For example, the first semiconductor layer 122 may include a semiconductor material having a composition equation of $Al_xIn_yGa_{(1-x-y)}N$ (0≤x≤1, 0≤y≤1, 0≤x+y≤1), and for example, may include any one or more of InAlGaN, AlGaAs, GaP, GaAs, GaAsP, and AlGaInP. When the first semiconductor layer 122 is an n-type semiconductor layer, the first conductive dopant may include an n-type dopant such as Si, Ge, Sn, Se, or Te. The first semiconductor layer 122 may be formed in a single layer or in multiple layers, without limitation thereto.

The active layer 124 may be disposed between the first semiconductor layer 122 and the second semiconductor layer 126, and may have any one of a single well structure, a multi-well structure, a single quantum well structure, a multi quantum well (MQW) structure, a quantum dot structure, and a quantum wire structure. The active layer 124 may have a paired structure of a well layer and a barrier layer, for example, any one or more of InGaN/GaN, InGaN/InGaN, GaN/AlGaN, InAlGaN/GaN, GaAs(InGaAs)/AlGaAs, and GaP(InGaP)/AlGaP, using group III-V compound semiconductors, without limitation thereto. The well layer may be formed of a material that has a smaller energy band gap than the energy band gap of the barrier layer.

The second semiconductor layer 126 may be disposed on the active layer 124, and may include compound semiconductors. The second semiconductor layer 126 may be formed of, for example, group III-V or II-VI compound semiconductors, and for example, may include a semiconductor material having a composition equation of $In_xAl_yGa_{(1-x-y)}N$ (0≤x≤1, 0≤y≤1, 0≤x+y≤1), or one or more of AlInN, AlGaAs, GaP, GaAs, GaAsP, and AlGaInP.

The second semiconductor layer 126 may be a second conductive type semiconductor layer. When the second semiconductor layer 126 is a p-type semiconductor layer, the second conductive dopant may be a p-type dopant such as Mg, Zn, Ca, Sr, or Ba. The second semiconductor layer 126 may be formed in a single layer or in multiple layers, without limitation thereto.

The first semiconductor layer 122 may be an n-type semiconductor layer and the second semiconductor layer 126 may be a p-type semiconductor layer, or the first semiconductor layer 122 may be a p-type semiconductor layer and the second semiconductor layer 126 may be an n-type semiconductor layer. Thus, the light-emitting structure 120 may include at least one of an n-p junction, p-n junction, n-p-n junction, or p-n-p junction structure.

In the following description, it is assumed that the first semiconductor layer 122 is an n-type semiconductor layer and that the second semiconductor layer 126 is a p-type semiconductor layer, but the embodiment is not limited thereto. That is, the present embodiment may be applied even when the first semiconductor layer 122 is a p-type semiconductor layer and the second semiconductor layer 126 is an n-type semiconductor layer.

In each of the light-emitting cells P1 to PM, the first electrode 132A or 132B may be disposed on the first semiconductor layer 122, and may be electrically connected to the first semiconductor layer 122. When the first semiconductor layer 122 is an n-type semiconductor layer, the first electrode 132A or 132B may be an n-type electrode. For example, referring to FIG. 2, in the first light-emitting cell P1, the first electrode 132A may be disposed on the first semiconductor layer 122, and referring to FIGS. 4a and 4b, in the third light-emitting cell P3, the first electrode 132A or 132B may be disposed on the first semiconductor layer 122. In order to dispose the first electrode 132A or 132B on the first semiconductor layer 122, a portion of the first semiconductor layer 122 of the light-emitting structure 120 may be exposed. That is, a contact hole (or a mesa-etched portion) CH may be formed to expose a portion of the first semiconductor layer 122 by mesa-etching a portion of the second semiconductor layer 126, the active layer 124, and the first semiconductor layer 122. At this time, the exposed surface of the first semiconductor layer 122 may be located lower than the lower surface of the active layer 124.

Alternatively, in each of the light-emitting cells P2 to PM, instead of separately providing the first electrode 132A or 132B on the first semiconductor layer 122, the first electrode 132A or 132B of an $i^{th}$ light-emitting cell Pi ($2 \leq i \leq M$) may be integrally formed with an $i-1^{st}$ connection line 160-$i$-1. For example, as illustrated in FIG. 4b, the first electrode 132B of the third light-emitting cell P3 may be formed separately from a second connection line 160-2, and as illustrated in FIG. 4a, the first electrode 132A of the third light-emitting cell P3 may be integrally formed with the first connection line 160-2.

In each of the light-emitting cells P2 to PM, the second electrode 130 may be disposed on the second semiconductor layer 126 and may be electrically connected to the second semiconductor layer 126. When the second semiconductor layer 126 is a p-type semiconductor layer, the second electrode 130 may be a p-type electrode. For example, referring to FIG. 2, in each of the first, second and third light-emitting cells P1, P2 and P3, the second electrode 130 is disposed on the second semiconductor layer 126.

Alternatively, in each of the light-emitting cells P1 to PM-1, instead of separately providing the second electrode 130 on the second semiconductor layer 126, unlike the illustration, the second electrode 130 of a $j^{th}$ light-emitting cell Pi ($1 \leq j \leq M-1$) may be integrally formed with a $j^{th}$ connection line 160-$j$.

In each of the light-emitting cells P1 to PM, each of the first electrode 132A or 132B and the second electrode 130 may have a structure in which at least one of an adhesive layer (not illustrated), a reflective layer (not illustrated), a barrier layer (not illustrated), or a bonding layer (not illustrated) is sequentially stacked. The adhesive layer of the first electrode 132A or 132B may include a material for ohmic contact with the first semiconductor layer 122, and the adhesive layer of the second electrode 130 may include a material for ohmic contact with the second semiconductor layer 126. For example, the adhesive layer may be formed in a single layer or in multiple layers using at least one material of Cr, Rd, or Ti.

The barrier layer may be disposed on the adhesive layer, and may be formed in a single layer or in multiple layers using a material including at least one of Ni, Cr, Ti, or Pt. For example, the barrier layer may be formed of an alloy of Cr and Pt.

In addition, the reflective layer interposed between the barrier layer and the adhesive layer may be formed of Ag or the like. The bonding layer may be disposed on the barrier layer, and may include Au.

Meanwhile, the first bonding pad 152 may be a pad that receives first power (e.g. (−) voltage), and may be a pad for the bonding of a wire (not illustrated). Referring to FIGS. 1 and 2, the first bonding pad 152 may be in electrical contact with the first semiconductor layer 122 of one light-emitting cell (e.g. P1) among the first to $M^{th}$ light-emitting cells P1 to PM via the first electrode 132A. Hereinafter, the light-emitting cell, which receives the first power, among the first to $M^{th}$ light-emitting cells, is referred to as a "first power cell" (or "negative power cell").

In addition, the second bonding pad 156A may be a pad that receives second power (e.g. (+) voltage), and may be a pad for the bonding of a wire (not illustrated). Referring to FIGS. 1 and 3, the second bonding pad 156A may be in electrical contact with the second semiconductor layer 126 of another light-emitting cell (e.g. P9) among the first to $M^{th}$ light-emitting cells P1 to PM via the second electrode 130. Hereinafter, the light-emitting cell, which receives the second power, among the first to $M^{th}$ light-emitting cells, is referred to as a "second power cell" (or "positive power cell").

In the case of FIGS. 1 to 3, each of the first and second power cells is illustrated as being singular, but the embodiment is not limited thereto. That is, when any one of the second to eighth light-emitting cells has the same structure as P1, the light-emitting cell may become the first power cell, and when any other one has the same structure as P9, the light-emitting cell may become the second power cell.

In addition, the connection pad 154 may be a pad that is included in the light-emitting cell, among the first to $M^{th}$ light-emitting cells, excluding the first and second power cells P1 and P9. The connection pad 154 may be disposed on the light-emitting structure 120 of the corresponding light-emitting cell, and may be omitted in some cases. When at least one of the second to eighth light-emitting cells P2 to P8 serves as the first power cell, the connection pad 154 may be disposed so as to be electrically connected to the first semiconductor layer 122, in the same manner as the first bonding pad 152. Alternatively, when at least one of the second to eighth light-emitting cells P2 to P8 serves as the second power cell, the connection pad 154 may be disposed so as to be electrically connected to the second semiconductor layer 126, in the same manner as the second bonding pad 156A.

In addition, although not illustrated, a conductive layer may further be disposed between the second electrode 130 and the second semiconductor layer 126. Each conductive layer reduces total reflection and has good light transmittance, and therefore, may increase the efficiency of extraction of light, which has been discharged from the active layer 124 and has passed through the second semiconductor layer 126. Each conductive layer may be formed in a single layer or in multiple layers using a transparent oxide-based material having high transmittance for each light wavelength, for example, at least one of indium tin oxide (ITO), tin oxide (TO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, or Ni/IrOx/Au/ITO.

Meanwhile, the first to $N^{th}$ connection lines 160-1 to 160-N serve to the multiple light-emitting cells P1 to PM to each other. That is, the first to $N^{th}$ connection lines 160-1 to 160-N serve to electrically interconnect neighboring light-emitting cells. Specifically, an $n^{th}$ connection line 160-$n$ (here, 1≤n≤N) is located on an $n^{th}$ light-emitting area Pn, an $n+1^{st}$ light-emitting area P(n+1), and the boundary area S between both the areas Pn and P(n+1), and serves to electrically interconnect the second electrode 130 of an $n^{th}$ light-emitting cell Pn and the first electrode 132A or 132B of an $n+1^{st}$ light-emitting cell P(n+1), which are adjacent to each other.

For example, referring to FIG. 2, the first connection line 160-1 (n=1) may electrically interconnect the second electrode 130 of the first light-emitting cell P1 and the first electrode 132A of the second light-emitting cell P2, which are adjacent to each other, and to this end, may be located on the first light-emitting area P1, the second light-emitting area P2, and the boundary area S between both the areas P1 and P2.

The first to $N^{th}$ connection lines 160-1 to 160-N may interconnect the first to $M^{th}$ light-emitting cells P1 to PM in series such that the first light-emitting cell P1, which is the first power cell in which the first bonding pad 152 is located, is a beginning point and the $M^{th}$ light-emitting area PM, which is the second power cell in which the second bonding pad 156A is located, is an ending point. However, the embodiment is not limited thereto, and at least some of the first to $M^{th}$ light-emitting cells P1 to PM may be electrically connected in parallel with each other by the connection lines.

Each of the first to $N^{th}$ connection lines 160-1 to 160-N may be formed of a material that is the same as or different from each of the first electrode 132A or 132B and the second electrode 130. When the first to $N^{th}$ connection lines 160-1 to 160-N are formed of the same material as the first electrode 132A or 132B and the second electrode 130, the connection line may be integrally formed with the first electrode 132A or 132B or the second electrode 130. FIGS. 2, 3 and 4a illustrate the case in which the first electrode 132A and the corresponding connection line (e.g. 160-2) are integrally formed with each other, and FIG. 4b illustrates the case in which the first electrode 132B and the corresponding connection line (e.g. 160-2) are separated from each other. Each of the first to $N^{th}$ connection lines 160-1 to 160-N may include at least one of Cr, Rd, Au, Ni, Ti or Pt, without limitation thereto.

Meanwhile, the first insulation layer 142 is disposed between the first to $N^{th}$ connection lines 160-1 to 160-N and neighboring light-emitting cells, which are connected to each other by the connection lines and electrically insulate the neighboring light-emitting cells and the connection lines from each other. That is, the first insulation layer 142 is disposed between the $n^{th}$ connection line 160-$n$ and the neighboring $n^{th}$ and the $n+1^{st}$ light-emitting cells Pn and P(n+1), which are connected to each other by the line 160-$n$, to electrically insulate the $n^{th}$ connection line 160-$n$ and the $n^{th}$ light-emitting cell Pn from each other and to electrically insulate the $n^{th}$ connection line 160-$n$ and the $n+1^{st}$ light-emitting cell P(n+1) from each other. For example, referring to FIG. 2, the first insulation layer 142 is disposed between neighboring second and third light-emitting cells P2 and P3, which are connected to each other by the second connection line 160-2, to electrically insulate the second connection line 160-2 from each of the second and third light-emitting cells P2 and P3.

In addition, the second insulation layer 144 is disposed so as to cover the boundary area S, the connection lines 160-1 to 160-N, the first insulation layer 142, the light-emitting structure 120, the first electrode 132A or 132B, and the second electrode 130. At this time, the second insulation layer 144, as illustrated in FIG. 2, may be disposed so as to expose the first electrode 132A in the first power cell P1, and as illustrated in FIG. 3, may be disposed so as to expose the second electrode 130 in the second power cell P9.

The second insulation layer 144 may electrically insulate the first bonding pad 152 and the second electrode 130 from each other in the first power cell P1, and may electrically insulate the second bonding pad 156A and the first electrode 132B or the eighth connection line 160-8A from each other in the second power cell P9.

Each of the first and second insulation layers 142 and 144 may be formed of a light-transmitting insulation material, for example, $SiO_2$, $SiO_x$, $SiO_xN_y$, $Si_3N_4$, or $Al_2O_3$, and may be formed as a distributed Bragg Reflector (DBR), but the embodiment is not limited thereto.

According to an embodiment, in the first power cell P1, the first electrode 132A may be electrically connected to the first bonding pad 152 through a plurality of first through-holes TH1. The first through-holes TH1 are formed by passing through the second insulation layer 144, the second semiconductor layer 126, and the active layer 124 so as to expose the first electrode 132A.

In addition, in the second power cell P9, the second electrode 130 may be electrically connected to the second bonding pad 156A through a plurality of second through-holes TH21. The second through-holes TH21 are formed by passing through the second insulation layer 144 so as to expose the second electrode 130.

Meanwhile, the planar shape of the first electrode 132A in the first power cell P1 (hereinafter referred to as the "first planar shape") may be the same as or different from the planar shape of the second electrode 130 in the second power cell P9 (hereinafter referred to as the "second planar shape").

Here, the first planar shape may include at least one of the planar arrangement form of the first through-holes TH1, the number of first through-holes TH1, the planar shape of each of the first through-holes TH1, the distance between the first through-holes TH1, or the size of each of the first through-holes TH1. In addition, the second planar shape may include at least one of the planar arrangement form of the second through-holes TH21, the number of second through-holes TH21, the planar shape of each of the second through-holes TH21, the distance between the second through-holes TH21, or the planar size of each of the second through-holes TH21.

When at least one of the features included in the first planar shape described above is different from at least one of the features included in the second planar shape, it can be said that the first planar shape and the second planar shape are different from each other. For example, even if the first and second through-holes TH1 and TH21 have the same number, planar shape, and planar arrangement form among the features included in the first and second planar shapes, when the first and second through-holes TH1 and TH21 have different sizes or distances therebetween, it can be said that the first planar shape and the second planar shape are different from each other.

For example, the number of first through-holes TH1 in the first planar shape and the number of second through-holes TH21 in the second planar shape may be different from each other. For example, as illustrated in FIG. 1, the number of first through-holes TH1 may be six, whereas the number of second through-holes TH21 may be three, although the embodiment is not limited thereto.

Alternatively, the number of first through-holes TH1 in the first planar shape and the number of second through-holes TH21 in the second planar shape may be the same.

In addition, in the first planar shape, the plurality of first through-holes TH1 may be arranged in at least one direction of a first direction or a second direction, which crosses the thickness direction (e.g. the x-axis) of the light-emitting structure 120. Here, the first and second directions may respectively mean the y-axis and the z-axis, which are orthogonal to the x-axis. For example, as illustrated in FIG. 1, the first planar shape may be configured such that three first through-holes TH1 are arranged along the y-axis and two first through-holes TH1 are arranged along the z-axis.

In addition, as illustrated in FIG. 1, the number of first through-holes TH1 arranged in the first direction and the number of first through-holes TH1 arranged in the second direction may be different from each other. Unlike the illustration of FIG. 1, the number of first through-holes TH1 arranged in the first direction and the number of first through-holes TH1 arranged in the second direction may be the same. That is, according to another embodiment, three or more first through-holes TH1 may be arranged along each of the y-axis and the z-axis.

In addition, in the first planar shape, the plurality of first through-holes TH1 may be arranged at the same distance or at different distances.

In addition, in the second planar shape, the plurality of second through-holes TH21 may be arranged in at least one direction of the first direction or the second direction. For example, as illustrated in FIG. 1, the second through-holes TH21 may be arranged only along the y-axis, which is the first direction, but the embodiment is not limited thereto. That is, according to another embodiment, similar to the planar shape in which the first through-holes TH1 are disposed, the second through-holes TH21 may be arranged in both the first direction and the second direction.

In addition, the plurality of second through-holes TH21 may be arranged at the same distance or at different distances.

In addition, each of the first and the second through-holes TH1 and TH21 is illustrated as having a circular planar shape in the case of FIG. 1, but the embodiment is not limited thereto. For example, each of the first and the second through-holes TH1 and TH21 may have an oval shape or a polygonal shape.

As described above, when the first planar shape and the second planar shape of the light-emitting device 100A according to the embodiment are different from each other, rather than being the same, the uniformity of light-emitting of the light-emitting device 100A may be increased. That is, as illustrated in FIG. 1, the plurality of second through-holes TH21 in the second power cell P9 are arranged in a single line, whereas the plurality of first through-holes TH1 in the first power cell P1 are disposed in multiple lines in the first direction and the second direction, which may improve the uniformity of light-emitting of the light-emitting device 100A.

FIG. 5 illustrates a plan view of a light-emitting device 100B according to another embodiment.

The light-emitting device 100B illustrated in FIG. 5 is substantially the same as the light-emitting device 100A illustrated in FIG. 1, excluding the shape of the second power cell P9, and thus, a repeated description will be omitted and only differences therewith will be described below.

In addition, a contact hole CH is a hole that exposes the first semiconductor layer of the light-emitting structure 120. In the light-emitting structure 120, the contact hole (or a mesa-etched portion) CH may be formed to expose the first semiconductor layer 122 by mesa-etching a portion of the second semiconductor layer 126, the active layer 124, and the first semiconductor layer 122.

Each of the first to $N^{th}$ connection lines 160-1 to 160-N may be electrically connected to the second semiconductor layer 126 of one of neighboring light-emitting cells, and may be electrically connected to the first semiconductor layer 122 of the other one of the neighboring light-emitting cells through the contact hole CH. That is, the $n^{th}$ connection line 160-$n$ may be electrically connected to the second semiconductor layer 126 of the $n^{th}$ light-emitting cell Pn, which is one of neighboring light-emitting cells Pn and P(n+1), via the second electrode 130, and may be electrically connected to the first semiconductor layer 122, which is exposed through the contact hole CH, of the n+$1^{st}$ light-emitting cell P(n+1), which is the other one of the neighboring light-emitting cells Pn and P(n+1).

In the case of FIGS. 1 to 5, each of the multiple light-emitting cells P2 to P9, excluding the first power cell P1, is illustrated as having two contact holes CH therein, but the embodiment is not limited thereto. That is, according to another embodiment, each of the second to ninth light-emitting cells P2 to P9 may have one contact hole or three or more contact holes CH.

In addition, the plurality of contact holes CH may be disposed parallel to each other so as to be spaced apart from each other in a direction (e.g. the z-axis) that crosses the x-axis, which is the thickness direction of the light-emitting structure 120.

FIG. 6 illustrates a plan view of one embodiment 160A of the $n^{th}$ connection line 160-$n$ included in the light-emitting devices 100A and 100B illustrated in FIGS. 1 and 5, and FIG. 7 illustrates a plan view of another embodiment 160B of the $n^{th}$ connection line 160-$n$ included in the light-emitting devices 100A and 100B illustrated in FIGS. 1 and 5.

First to seventh connection lines 160-1 to 160-7 illustrated in FIGS. 1 and 5 and an eighth connection line 160-8A illustrated in FIG. 1 may have the planar shape illustrated in FIG. 6, and an eighth connection line 160-8B illustrated in FIG. 5 may have the planar shape illustrated in FIG. 7, but the embodiments are not limited thereto. That is, it is to be noted that the first to seventh connection lines 160-1 to 160-7 illustrated in FIGS. 1 and 5 and the eighth connection line 160-8A illustrated in FIG. 1 may have the planar shape illustrated in FIG. 7.

Referring to FIGS. 6 and 7, each of the connection lines 160A and 160B may include a connection body 162 and multiple connection branches 164-11 and 164-12, or 164-2, 164-31 and 164-32.

An $n^{th}$ connection body 162 is electrically spaced apart from the lateral portion of the light-emitting structure 120 of one Pn of neighboring light-emitting cells Pn and P(n+1) by the first insulation layer 142, and is electrically connected to the second electrode 130 of one Pn of the neighboring light-emitting cells Pn and P(n+1).

In addition, the multiple connection branches 164-11 and 164-12, or 164-2, 164-31 and 164-32 extend from the connection body 162 and are electrically connected to the first semiconductor layer 122 through multiple contact holes CH, which are included in the other one P(n+1) of the neighboring light-emitting cells Pn and P(n+1).

According to an embodiment, as illustrated in FIG. 6, the multiple connection branches may include first connection branch 164-11 and 164-12. The first connection branches 164-11 and 164-12 may extend from the connection body 162 in the first direction (e.g. along the y-axis), which crosses the thickness direction (e.g. the x-axis), and may be disposed so as to be spaced apart from each other in the second direction (e.g. the z-axis), which crosses both the first direction and the thickness direction. At this time, the first connection branches 164-11 and 164-12 may extend in the first direction from a middle point of the connection body 162. For example, the $1-1^{st}$ connection branch 164-11 may extend in the first direction from an upper point Z1 one-third of the way along entire z-axis length ZT from the uppermost end of the connection body 162, and the $1-2^{nd}$ connection branch 164-12 may extend in the first direction from a lower point Z2 one-third of the way along the entire z-axis length ZT from the lowermost end of the connection body 162. Although each of the upper point Z1 and the lower point Z2 has been described in the present embodiment as being a point one-third of the way along the entire z-axis length ZT, it may be within a range from a point one-fourth to one-third of the way along the same, without limitation thereto. When the first connection branches 164-11 and 164-12 protrude from the middle portion of the connection body 162, current spreading may be improved.

Alternatively, according to another embodiment, as illustrated in FIG. 7, the multiple connection branches may include a second connection branch 164-2 and third connection branches 164-31 and 164-32. The second connection branch 164-2 may extend from the connection body 162 so as to be disposed in the second direction (e.g. along the z-axis) and the first direction (e.g. along the y-axis), which cross the thickness direction. In addition, the third connection branches 164-31 and 164-32 may extend from the second connection branch 164-2 so as to be disposed in the first direction (e.g. along the y-axis), which crosses both the thickness direction and the second direction.

In addition, each of the multiple connection branches 164-11, 164-12, 164-31 and 164-32 may have a striped planar shape, as illustrated in FIGS. 6 and 7. At this time, as illustrated in FIG. 1, the multiple second through-holes TH21 included in the second power cell P9 may be arranged in the first direction (e.g. along the y-axis) between the connection branches 164-11 and 164-12. In addition, as illustrated in FIG. 5, the plurality of second through-holes TH21 included in the second power cell P9 may be arranged in the first direction (e.g. along the y-axis) and the second direction (e.g. along the z-axis) between the connection branches 164-31 and 164-32.

FIG. 8 illustrates a cross-sectional view taken along line C-C' illustrated in FIG. 1, and FIG. 9 illustrates a cross-sectional view taken along line D-D' illustrated in FIG. 5.

Referring to FIG. 8, it can be appreciated that the multiple connection branches 160-8A; 164-11 and 164-12 are disposed so as to overlap the second bonding pad 156A in the thickness direction (e.g. along the x-axis).

On the other hand, referring to FIG. 9, it can be appreciated that the multiple connection branches 160-8B: 164-31 and 164-32 may not overlap the second bonding pad 156B in the thickness direction, but may be disposed so as to bypass the second bonding pad 156B. For example, as illustrated in FIG. 9, the connection branches 160-31 and 164-32 may be disposed on the edge of the second power cell P9, but the embodiment is not limited thereto. That is, so long as the connection branches do not overlap the second bonding pad 156B along the x-axis, which is the thickness direction of the light-emitting structure 120, the embodiment is not limited as to the specific position at which the connection branches are disposed in the second power cell P9.

As illustrated in FIGS. 1 and 8, when the connection branches 160-8A: 164-11 and 164-12 are disposed so as to overlap each other in the thickness direction, a portion "K1" and a portion "K2" may inevitably have a stepped structure during mesa etching for forming the contact hole CH and during metal deposition for forming the first electrode 132B. Due to this stepped structure, the first and second insulation layers 142 and 144 may be broken or cracked by shocks due to external mechanical force or electrical force, causing short-circuit or current leakage in portions that are electrically separated from each other by the first and second insulation layers 142 and 144, which may deteriorate the reliability of the light-emitting device 100A.

On the other hand, as illustrated in FIGS. 5 and 9, when the connection branches 160-8B: 164-31 and 164-32 are disposed so as not to overlap the second bonding pad 156B along the x-axis, which is the thickness direction, as illustrated in FIG. 8, the portions "K1" and "K2" have no stepped structure and thus prevent the problems described above, which may increase the reliability of the light-emitting device 100B. Moreover, when the connection branches 164-31 and 164-32 are disposed on the edge of the second power cell P9, the area in which second through-holes TH22 may be disposed may be increased.

FIG. 10 illustrates a circuit diagram of the light-emitting devices 100A and 100B illustrated in FIGS. 1 and 5.

Referring to FIGS. 1, 5 and 10, the light-emitting devices 100A and 100B may include a common single (−) terminal, for example, one first bonding pad 152, and a common single (+) terminal, for example, one second bonding pad 156A or 156B, but the embodiment is not limited thereto.

According to another embodiment, any one point between a cathode of a second light-emitting cell P2 and a cathode of an eighth light-emitting cell P8 may be used as a (−) terminal between the first bonding pad 152 and the second bonding pad 156A or 156B. For example, a second node N2, which is a cathode of a sixth light-emitting cell P6, or a third node N3, which is a cathode of a third light-emitting cell P3, may be used as a (−) terminal. When the second node N2 is used as a (−) terminal, the sixth light-emitting cell P6 may have the same first planar shape as a first power cell P1, and the connection pad 154 of the sixth light-emitting cell P6 may be electrically connected to the first semiconductor layer 122 of the sixth light-emitting cell P6 in the same manner as the first bonding pad 152.

According to still another embodiment, any one point between an anode of the eighth light-emitting cell P8 and an anode of the second light-emitting cell P2 may be used as a (+) terminal between the first bonding pad 152 and the second bonding pad 156A or 156B. For example, a first node N1, which is the anode of the eighth light-emitting cell P8, a second node N2, which is an anode of a fifth light-emitting cell P5, or a third node N3, which is the anode of the second light-emitting cell P2, may be used as a (+) terminal. When the third node N3 is used as a (+) terminal, the second light-emitting cell P2 may have the same second planar shape as the second power cell P9, and the connection pad 154 of the second light-emitting cell P2 may be electrically connected to the second semiconductor layer 126 of the second light-emitting cell P2 in the same manner as the second bonding pad 156A or 156B.

Each of the first to $M^{th}$ light-emitting cells P1 to PM of the light-emitting devices 100A and 100B illustrated in FIGS. 2, 3, 8 and 9 has been described above as having a horizontal bonding structure, but the embodiments are not limited thereto. That is, it is to be noted that the present embodiment may also be applied to the case in which each of the first to $M^{th}$ light-emitting cells has a vertical bonding or flip-chip bonding structure.

A plurality of light-emitting device packages according to the embodiments may be disposed on a substrate to form an array, and optical members, such as a light guide plate, a prism sheet, and a diffusion sheet may be disposed on the optical path of the light-emitting device packages. The light-emitting device packages, the substrate, and the optical members may function as a backlight unit.

In addition, a display apparatus, an indicator apparatus, and a lighting apparatus including the light-emitting device packages according to the embodiments may be realized.

Here, the display apparatus may include a bottom cover, a reflector disposed on the bottom cover, a light-emitting module configured to emit light, a light guide plate disposed in front of the reflector to forwardly guide the light emitted from the light-emitting module, optical sheets including prism sheets disposed in front of the light guide plate, a display panel disposed in front of the optical sheets, an image signal output circuit connected to the display panel so as to supply an image signal to the display panel, and a color filter disposed in front of the display panel. Here, the bottom cover, the reflector, the light-emitting module, the light guide plate, and the optical sheets may construct a backlight unit.

In addition, the lighting apparatus may include a light source module having a substrate and a light-emitting device package according to the embodiments, a heat radiator configured to dissipate heat from the light source module, and a power supply unit configured to process or convert an electric signal provided from the outside so as to supply the same to the light source module. For example, the lighting apparatus may include a lamp, a headlamp, or a street light.

The head lamp may include a light-emitting module, which includes light-emitting device packages disposed on a substrate, a reflector, which reflects light emitted from the light-emitting module in a given direction, for example, in a forward direction, a lens, which forwardly refracts the light reflected by the reflector, and a shade, which blocks or reflects some of the light, which has been reflected by the reflector and directed to the lens, so as to achieve the light distribution pattern desired by a designer.

Although embodiments have been described above, the above description is merely given by way of example and is not intended to limit the disclosure, and it will be apparent to those skilled in the art that various modifications and applications, which are not exemplified above, may be devised without departing from the essential characteristics of the embodiments. For example, the respective constituent elements described in the embodiments may be modified in various ways. In addition, differences associated with these modifications and alterations should be interpreted as being included in the scope of the disclosure defined by the accompanying claims.

MODE FOR INVENTION

Modes for the implementation of embodiments have sufficiently been described in the "best mode" described above.

INDUSTRIAL APPLICABILITY

A light-emitting device according to embodiments may be applied to a display apparatus, an indicator apparatus, and a lighting apparatus.

The invention claimed is:

1. A light-emitting device, comprising:
   a substrate;
   a plurality of light-emitting cells disposed on the substrate so as to be spaced apart from each other; and
   a connection line configured to electrically interconnect neighboring light-emitting cells,
   wherein each of the light-emitting cells comprises:
      a light-emitting structure comprising a first semiconductor layer, an active layer, and a second semiconductor layer disposed on the substrate; and
      first and second electrodes configured to be electrically connected to the first and second semiconductor layers respectively,
   wherein the light-emitting cells comprise:
      a first power cell configured to receive first power via the first electrode; and
      a second power cell configured to receive second power via the second electrode,
   wherein the first electrode in the first power cell has a first planar shape different from a second planar shape of the second electrode in the second power cell, and
   wherein each of the light-emitting cells excluding the first power cell further comprises a contact hole configured to expose the first semiconductor layer in the light-emitting structure.

2. The light-emitting device according to claim 1, further comprising a first insulation layer disposed between the connection line and the neighboring light-emitting cells to electrically insulate the connection line and the neighboring light-emitting cells from each other.

3. The light-emitting device according to claim 2, further comprising:
   a first bonding pad configured to be electrically connected to the first electrode;
   a second bonding pad configured to be electrically connected to the second electrode; and
   a second insulation layer disposed between the first bonding pad and the second electrode to electrically insulate the first bonding pad and the second electrode from each other.

4. The light-emitting device according to claim 3, wherein the first electrode is connected to the first bonding pad through a plurality of first through-holes, which pass through the second insulation layer, the second semiconductor layer, and the active layer, and wherein the second electrode is connected to the second bonding pad through a plurality of second through-holes, which pass through the second insulation layer.

5. The light-emitting device according to claim 4, wherein the first planar shape comprises at least one of a planar arrangement form of the first through-holes, a number of the first through-holes, a planar shape of each of the first through-holes, a distance between the first through-holes, or a planar size of each of the first through-holes, and wherein the second planar shape comprises at least one of a planar arrangement form of the second through-holes, a number of the second through-holes, a planar shape of each of the second through-holes, a distance between the second through-holes, or a planar size of each of the second through-holes.

6. The light-emitting device according to claim 5, wherein the number of the first through-holes in the first planar shape and the number of the second through-holes in the second planar shape are different from each other.

7. The light-emitting device according to claim 5, wherein the number of the first through-holes in the first planar shape and the number of the second through-holes in the second planar shape are the same.

8. The light-emitting device according to claim 5, wherein the first through-holes in the first planar shape are arranged in at least one direction of a first direction or a second direction, which crosses a thickness direction of the light-emitting structure, and wherein the first through-holes are arranged at a constant distance.

9. The light-emitting device according to claim 5, wherein the second through-holes in the second planar shape are arranged in at least one direction of a first direction or a second direction, which crosses a thickness direction of the light-emitting structure, and wherein the second through-holes are arranged at a constant distance.

10. The light-emitting device according to claim 5, wherein the connection line is configured to be electrically connected to the second semiconductor layer of one of the neighboring light-emitting cells and is configured to be electrically connected to the first semiconductor layer through the contact hole of a remaining one of the neighboring light-emitting cells.

11. The light-emitting device according to claim 10, wherein the contact hole comprises a plurality of contact holes disposed parallel to each other and spaced apart from each other in a direction, which crosses a thickness direction of the light-emitting structure.

12. The light-emitting device according to claim 11, wherein the connection line comprises:
a connection body configured to be electrically spaced apart from a lateral portion of the light-emitting structure of one of the neighboring light-emitting cells by the first insulation layer and configured to be electrically connected to the second electrode of the one of the neighboring light-emitting cells; and
a plurality of connection branches extending from the connection body so as to be electrically connected to the first semiconductor layer through the contact holes included in a remaining one of the neighboring light-emitting cells.

13. The light-emitting device according to claim 12, wherein the connection branches comprise a plurality of first connection branches extending from the connection body in a first direction, which crosses the thickness direction, and disposed so as to be spaced apart from each other in a second direction, which crosses each of the first direction and the thickness direction.

14. The light-emitting device according to claim 12, wherein the connection branches comprise:
a second connection branch extending from the connection body so as to be disposed in a second direction, which crosses the thickness direction; and
a third connection branch extending from the second connection branch so as to be disposed in a first direction, which crosses each of the thickness direction and the second direction.

15. The light-emitting device according to claim 12, wherein each of the connection branches has a striped planar shape.

16. The light-emitting device according to claim 15, wherein the second through-holes are arranged in the direction between the connection branches.

17. The light-emitting device according to claim 12, wherein the connection branches are disposed so as to overlap the second bonding pad in the thickness direction.

18. The light-emitting device according to claim 12, wherein the connection branches are disposed so as not to overlap the second bonding pad in the thickness direction.

19. The light-emitting device according to claim 18, wherein the connection branches are disposed on an edge of the second power cell.

20. A light-emitting device, comprising:
a substrate;
a plurality of light-emitting cells disposed on the substrate so as to be spaced apart from each other; and
a connection line configured to electrically interconnect neighboring light-emitting cells,
wherein each of the light-emitting cells comprises:
a light-emitting structure comprising an n-type semiconductor layer, an active layer, and a p-type semiconductor layer disposed on the substrate; and
n-type and p-type electrodes configured to be electrically connected to the n-type and p-type semiconductor layers respectively,
wherein the light-emitting cells comprises:
a negative power cell configured to receive a negative voltage via an n-type bonding pad connected to the n-type electrode; and
a positive power cell configured to receive a positive voltage via a p-type bonding pad connected to the p-type electrode,
wherein each of the light-emitting cells excluding the negative power cell further comprises a contact hole passing through the p-type semiconductor layer and the active layer to expose the n-type semiconductor layer,
wherein the connection line is configured to be electrically connected to the n-type semiconductor layer through a respective one of the contact holes, and
wherein the contact hole is disposed so as not to overlap the p-type bonding pad in a thickness direction of the light-emitting structure.

* * * * *